US012635437B2

(12) United States Patent
Morikazu et al.

(10) Patent No.: US 12,635,437 B2
(45) Date of Patent: May 19, 2026

(54) METHOD OF PROCESSING WAFER USING SUPPORT SUBSTRATE AND JOINT MEMBER

(71) Applicant: DISCO CORPORATION, Ota-ku (JP)

(72) Inventors: Hiroshi Morikazu, Tokyo (JP); Yuki Suto, Tokyo (JP); Tasuku Koyanagi, Tokyo (JP); Masato Terajima, Tokyo (JP); Junya Mimura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 398 days.

(21) Appl. No.: 18/476,666

(22) Filed: Sep. 28, 2023

(65) Prior Publication Data

US 2024/0128086 A1     Apr. 18, 2024

(30) Foreign Application Priority Data

Oct. 14, 2022     (JP) ................................. 2022-165605

(51) Int. Cl.
H10P 52/00 (2026.01)
H10P 72/00 (2026.01)
H10P 72/70 (2026.01)

(52) U.S. Cl.
CPC .......... H10P 52/00 (2026.01); H10P 72/0428 (2026.01); H10P 72/74 (2026.01); *H10P 72/7416* (2026.01)

(58) Field of Classification Search
CPC ............. H01L 21/304; H01L 21/67092; H01L 21/6835; H10P 52/00; H10P 72/0428; H10P 72/74
See application file for complete search history.

(56) References Cited

U.S. PATENT DOCUMENTS

| | | |
|---|---|---|
| 2016/0023436 A1 | 1/2016 | Liu et al. |
| 2019/0057891 A1* | 2/2019 | Marinov ........... H01L 21/67132 |
| 2020/0144095 A1* | 5/2020 | Mikami ................ B23K 26/08 |
| 2022/0059386 A1* | 2/2022 | Fujikawa .......... H01L 21/67103 |
| 2022/0406602 A1* | 12/2022 | Tanoue ..................... B24B 7/04 |

FOREIGN PATENT DOCUMENTS

JP         2001284303 A     10/2001

OTHER PUBLICATIONS

Office Action issued by the German Patent Office for corresponding Patent Application No. 10 2023 209 740.0, dated May 2, 2025.

* cited by examiner

*Primary Examiner* — Michael Jung
(74) *Attorney, Agent, or Firm* — Greer Burns & Crain Ltd.

(57) ABSTRACT

A method of processing a wafer includes a composite substrate forming step of joining a face side of a wafer and a surface of a support substrate to each other with a joint member interposed therebetween, a grinding step of grinding a reverse side of the wafer of the composite substrate to thin down the wafer to a finished thickness, a transfer member affixing step of affixing a transfer member to the reverse side of the wafer, a joint member breaking step of breaking the joint member by applying a laser beam having a wavelength transmittable through the support substrate and absorbable by the joint member to the composite substrate from another surface side of the support substrate, and a transferring step of peeling off the support substrate from the wafer and transferring the wafer to the transfer member.

5 Claims, 14 Drawing Sheets

METHOD OF PROCESSING WAFER USING SUPPORT SUBSTRATE AND JOINT MEMBER

BACKGROUND OF THE INVENTION

Field of the Invention

The present invention relates to a method of processing a wafer.

Description of the Related Art

Typically, for thinning down devices on a wafer, there has been employed a technology in which a grinding wheel, while in rotation, is held in abrasive contact with the wafer to thin down the wafer (see, for example, Japanese Patent Laid-open No. 2001-284303).

In recent years, multilayered memory chips and power devices with higher withstand voltages have led to demands for devices that have been further thinned down. Using conventional back-grinding (BG) tapes to support wafers that have been finished to a reduced thickness is liable to break the wafers in subsequent processing steps such as a delivery step.

SUMMARY OF THE INVENTION

In view of the above shortcomings, it has been proposed to grind a device wafer that has been bonded to a support substrate, thereby reducing the risk of breaking the device wafer. However, it has been made clear that there are cases where a device wafer may crack when it is peeled off from a support substrate, for it is difficult to peel off a heat-resistant adhesive layer that is often combined with the device wafer to withstand vapor deposition of a metal film on the ground surface of the device wafer.

It is therefore an object of the present invention to provide a method of processing a wafer that is capable of reducing the risk of breaking a wafer with patterns formed thereon when the wafer is thinned down.

In accordance with an aspect of the present invention, there is provided a method of processing a wafer, including a composite substrate forming step of joining a face side of a wafer with patterns formed in respective areas demarcated on the face side by a plurality of projected dicing lines established thereon and a surface of a support substrate to each other with a joint member interposed therebetween, a grinding step of, after the composite substrate forming step has been carried out, grinding a reverse side of the wafer of the composite substrate to thin down the wafer to a finished thickness, a transfer member affixing step of affixing a transfer member to the reverse side of the wafer that has been ground in the grinding step, a joint member breaking step of breaking the joint member by applying a laser beam having a wavelength transmittable through the support substrate and absorbable by the joint member to the composite substrate from another surface side of the support substrate, and a transferring step of, after the joint member breaking step has been carried out, peeling off the support substrate from the wafer and transferring the wafer to the transfer member.

Preferably, the method of processing a wafer further includes a dividing step of, before the joint member breaking step is carried out or after the joint member breaking step has been carried out, dividing the wafer along the projected dicing lines.

Preferably, the method of processing a wafer further includes a bending moment applying step of, after the joint member breaking step has been carried out, applying a bending moment to a region of the composite substrate that includes an outer circumferential portion thereof.

Preferably, in the method of processing a wafer, the bending moment applying step is repeatedly carried out.

The present invention is advantageous in that it makes it possible to reduce the risk of breaking a wafer with patterns formed thereon when the wafer is thinned down.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Figure 1:
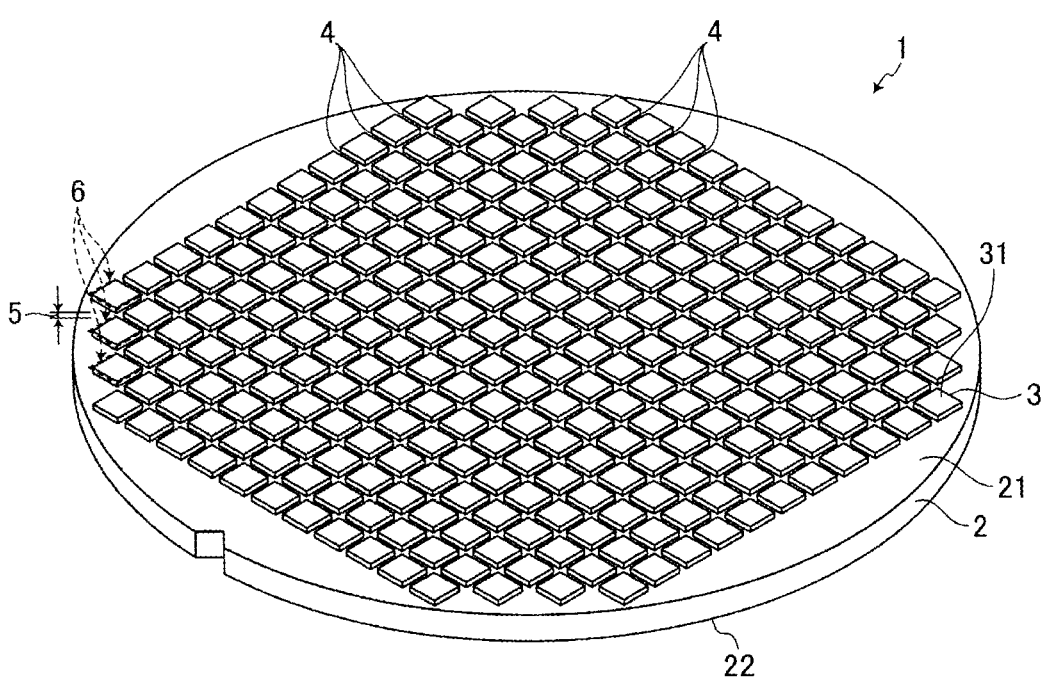
FIG. 1 is a perspective view schematically illustrating a structural example of a wafer to be processed by a method of processing a wafer according to a first embodiment of the present invention.

Preferred embodiments of the present invention will be described hereinbelow with reference to the accompanying drawings. The present invention is not limited to the details of the embodiments described below. The components described below cover those which can easily be anticipated by those skilled in the art and those which are essentially identical to those described below. Moreover, the arrangements described below can be combined in appropriate manners. Various omissions, replacements, or changes of the arrangements may be made without departing from the scope of the present invention. In the description below, those components that are identical to each other are denoted by identical reference characters.

Figure 2:
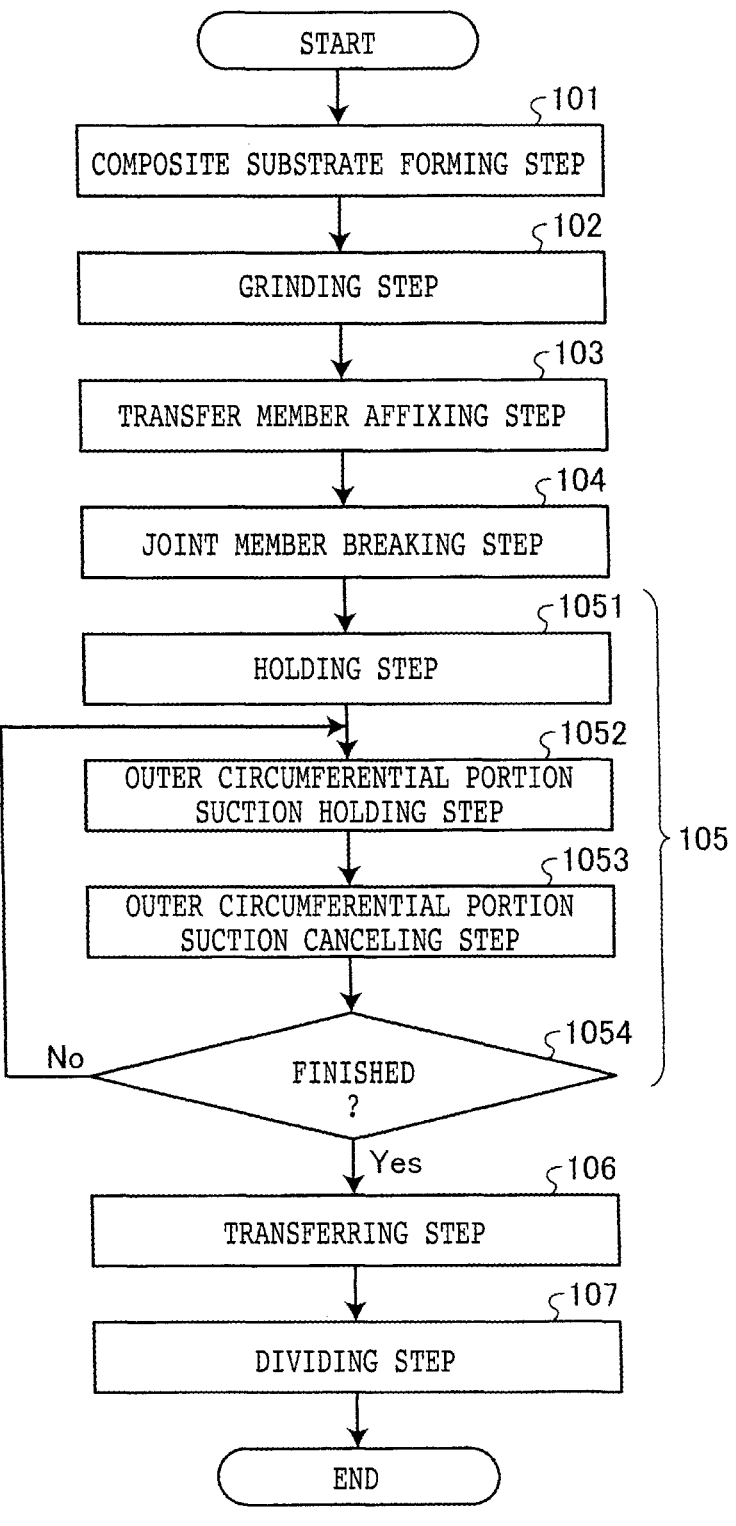
FIG. 2 is a flowchart of the sequence of the method of processing a wafer according to the first embodiment.

A method of processing a wafer according to a first embodiment of the present invention will be described below with reference to the drawings. FIG. 1 schematically illustrates in perspective a structural example of a wafer to be processed by the method of processing a wafer according to the first embodiment. FIG. 2 is a flowchart of the sequence of the method of processing a wafer according to the first embodiment. The method of processing a wafer according to the first embodiment refers to a method of processing a wafer 1 illustrated in FIG. 1.

The wafer 1 to be processed by the method of processing a wafer according to the first embodiment is a semiconductor wafer shaped as a circular plate including a circular base substrate 2 made of silicon, SiC, or the like, for example. As illustrated in FIG. 1, the wafer 1 includes patterns 3 formed in respective areas demarcated on a face side 21 of the substrate 2 by a grid of projected dicing lines 4 established thereon. The patterns 3 represent logic circuits such as known logic gates, sequential circuits, and counters.

The method of processing a wafer according to the first embodiment is a method of thinning down the wafer 1 to a predetermined finished thickness 5 and dividing the wafer 1 into individual chips 6. Each of the chips 6 includes a portion of the substrate 2 and one of the patterns 3. As illustrated in FIG. 2, the method of processing a wafer according to the first embodiment includes a composite substrate forming step 101, a grinding step 102, a transfer member affixing step 103, a joint member breaking step 104, a bending moment applying step 105, a transferring step 106, and a dividing step 107.

Figure 3:
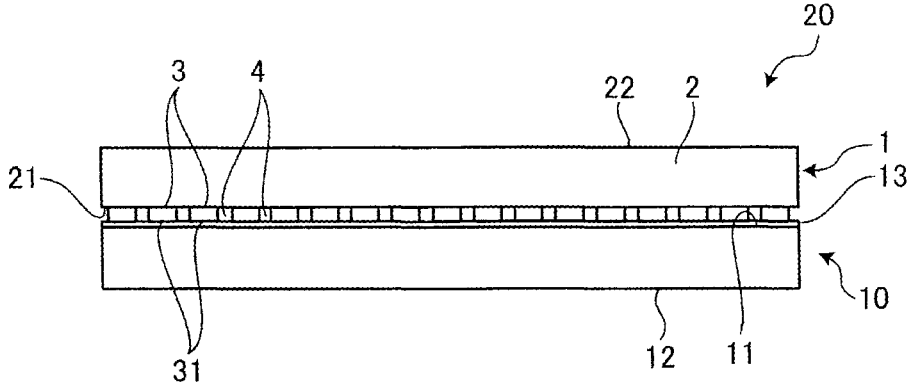
FIG. 3 is a side elevational view schematically illustrating a composite substrate formed in a composite substrate forming step of the method of processing a wafer illustrated in FIG. 2.

FIG. 3 schematically illustrates in side elevation a composite substrate formed in the composite substrate forming step 101 of the method of processing a wafer illustrated in FIG. 2. As illustrated in FIG. 3, the composite substrate forming step 101 is a step of forming a composite substrate 20 by joining face sides 31 of the patterns 3 formed on the face side 21 of the substrate 2 of the wafer 1 and a surface 11 of a support substrate 10 to each other with a joint member 13 interposed therebetween.

According to the first embodiment, in the composite substrate forming step 101, the surface 11 of the support substrate 10 that is shaped as a circular plate including a hard material and having the same diameter as the wafer 1 is joined to the face sides 31 of the patterns 3 formed on the face side 21 of the substrate 2 of the wafer 1 by the joint member 13. According to the present invention, the support substrate 10 may be made of molybdenum (Mo), copper (Cu), silicon (Si), or the like. According to the first embodiment, the support substrate 10 is made of sapphire and equal in diameter to the wafer 1.

The joint member 13 may be made of polyimide or resist. If the joint member 13 is made of polyimide, then the joint member 13 is difficult to remove by cleaning or the like and needs to be physically removed by grinding processing. Thus, the joint member 13 should preferably be made of resist. According to the first embodiment, it is desirable that the joint member 13 be resistant to heat of the temperature of vapor deposition of a metal film on a reverse side 22 of the substrate 2 after the grinding step 102.

Figure 4:
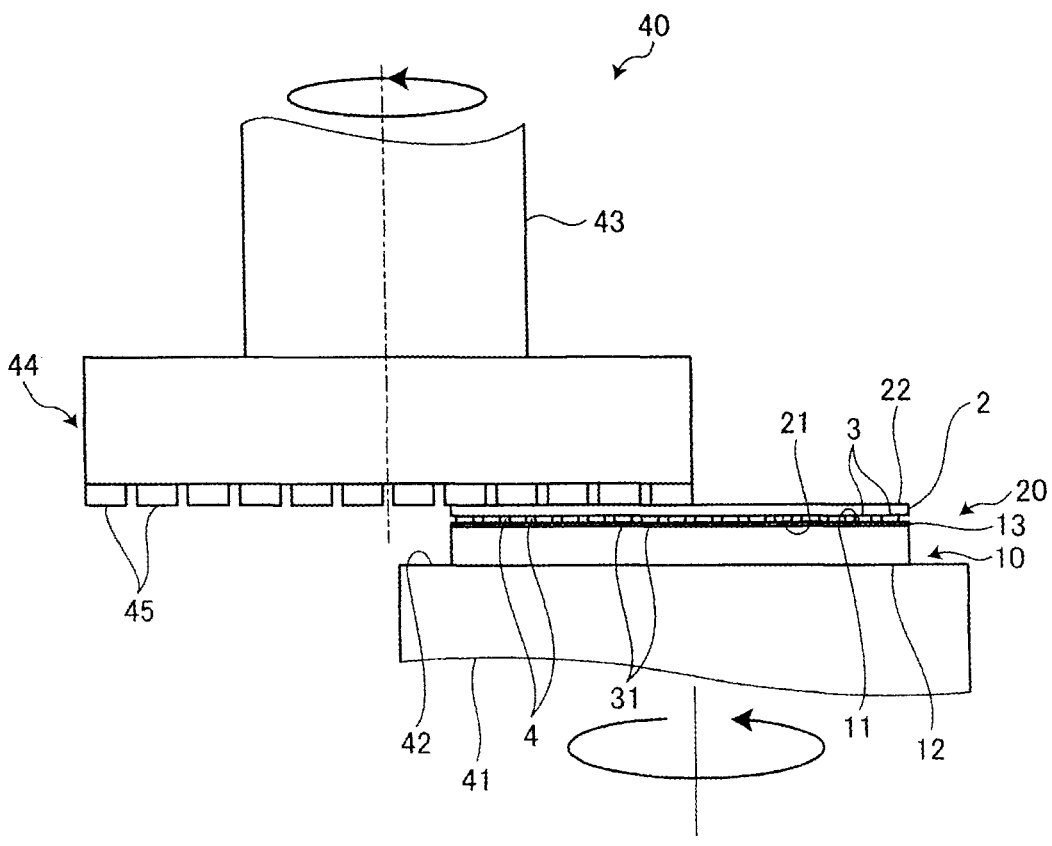
FIG. 4 is a side elevational view schematically illustrating a grinding step of the method of processing a wafer illustrated in FIG. 2.
Figure 5:
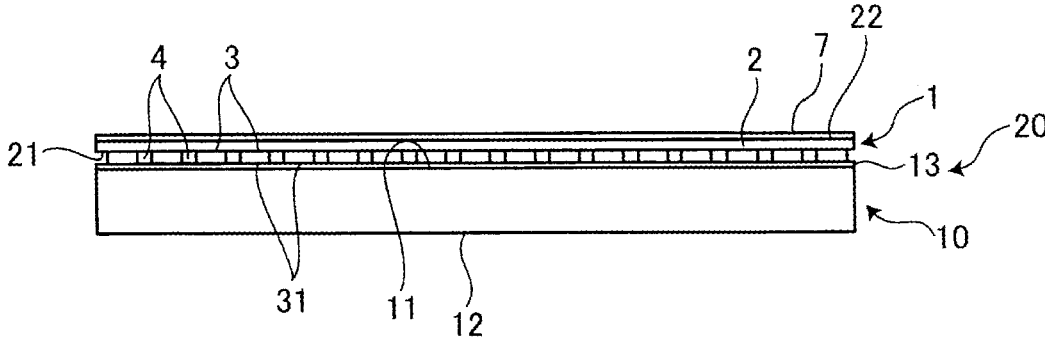
FIG. 5 is a side elevational view schematically illustrating the composite substrate that has undergone the grinding step of the method of processing a wafer illustrated in FIG. 2.

FIG. 4 schematically illustrates in side elevation the grinding step 102 of the method of processing a wafer illustrated in FIG. 2. FIG. 5 schematically illustrates in side elevation the composite substrate 20 that has undergone the grinding step 102 of the method of processing a wafer illustrated in FIG. 2.

The grinding step 102 is a step of, after the composite substrate forming step 101 has been carried out, grinding the reverse side 22 of the wafer 1 of the composite substrate 20 to thin down the wafer 1 to the finished thickness 5. According to the first embodiment, in the grinding step 102, a grinding apparatus 40 holds another surface 12, opposite the surface 11, of the support substrate 10 of the composite substrate 20 under suction on a holding surface 42 of a chuck table 41.

Specifically, as illustrated in FIG. 4, the grinding apparatus 40 rotates a grinding wheel 44 about its central axis by rotating a spindle 43 and also rotates the chuck table 41 about its central axis. At the same time, while supplying a grinding liquid from an unillustrated grinding liquid nozzle to the substrate 2, the grinding apparatus 40 brings grindstones 45 of the grinding wheel 44 into abrasive contact with the reverse side 22 of the wafer 1 and moves the grindstones 45 toward the chuck table 41 at a predetermined rate, causing the grindstones 45 to grind the reverse side 22 of the wafer 1. When the wafer 1 has been thinned down to the finished thickness 5, the grinding apparatus 40 lifts the grinding wheel 44 back away from the reverse side 22 of the wafer 1.

Thereafter, according to the first embodiment, in the grinding step 102, metal such as copper, for example, is vapor-deposited on the reverse side 22 of the wafer 1, forming a vapor-deposited film 7 having a uniform thickness on the reverse side 22, as illustrated in FIG. 5. According to the first embodiment, when the metal is vapor-deposited, the composite substrate 20 is heated to approximately 200° C., for example. If the thickness, e.g., 20 μm, of the vapor-deposited film 7 on the reverse side 22 is larger than the thickness, e.g., 10 μm, of the substrate 2 of the wafer 1, then the wafer 1 is warped toward the vapor-deposited film 7.

Figure 6:
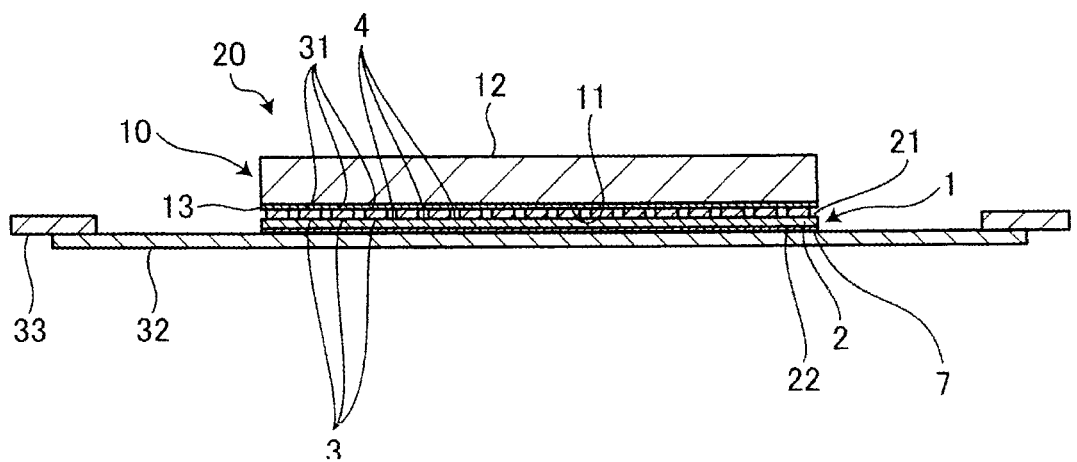
FIG. 6 is a cross-sectional view schematically illustrating the composite substrate that has undergone a transfer member affixing step of the method of processing a wafer illustrated in FIG. 2.

FIG. 6 schematically illustrates in cross section the composite substrate 20 that has undergone the transfer member affixing step 103 of the method of processing a wafer illustrated in FIG. 2. The transfer member affixing step 103 is a step of affixing a transfer member 32 to the vapor-deposited film 7 on the reverse side 22 that has been ground in the grinding step 102. According to the first embodiment, in the transfer member affixing step 103, a tape including a glue layer that is flexible and adhesive and a base layer that is laminated on the glue layer and is flexible and non-adhesive is affixed as the transfer member 32 to the vapor-deposited film 7 on the reverse side 22 of the wafer 1 of the composite substrate 20.

Specifically, as illustrated in FIG. 6, the transfer member 32 shaped as a circular plate that is larger in diameter than the wafer 1 is affixed to the vapor-deposited film 7 on the reverse side 22, and an annular frame 33 having an inside diameter larger than the outside diameter of the wafer 1 is affixed to an outer circumferential edge portion of the transfer member 32, so that the composite substrate 20 is supported on the annular frame 33 by the transfer member 32.

Figure 7:
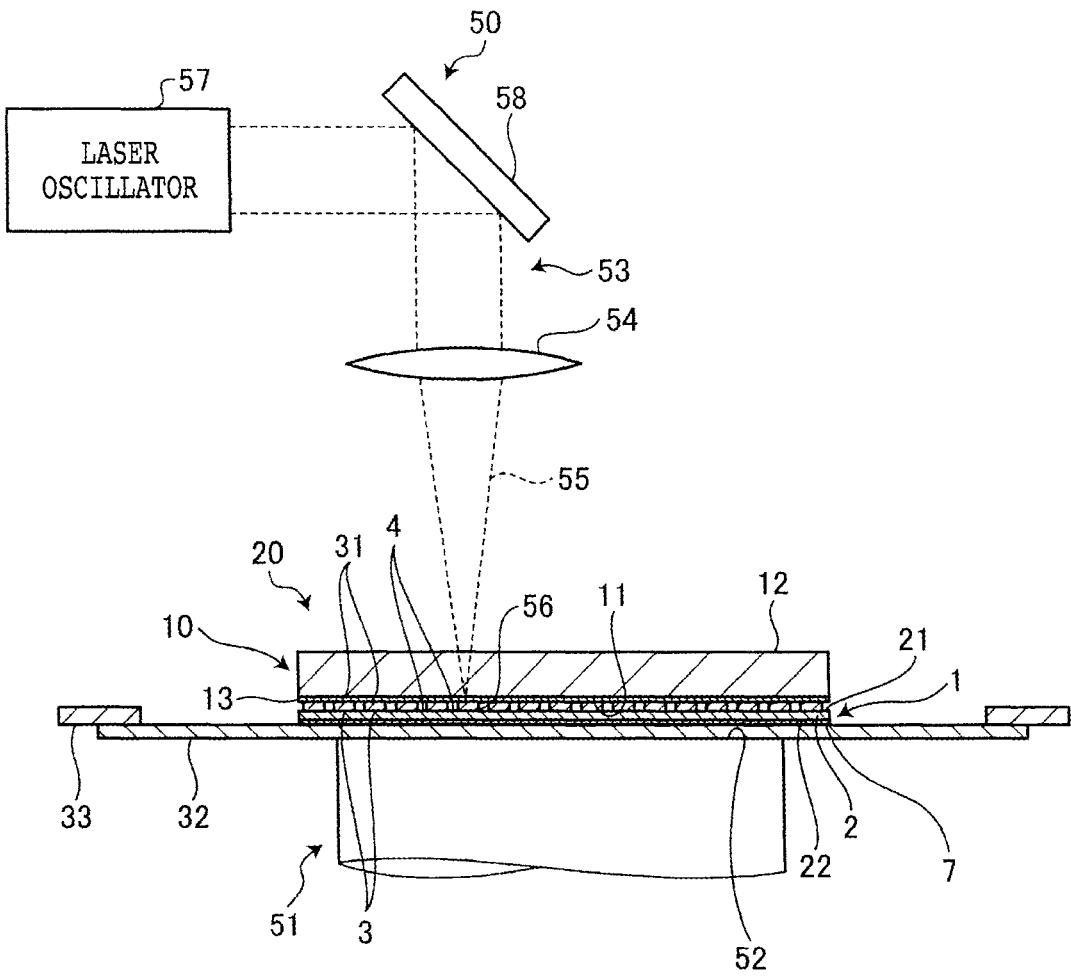
FIG. 7 is a side elevational view schematically illustrating a joint member breaking step of the method of processing a wafer illustrated in FIG. 2.
Figure 8:
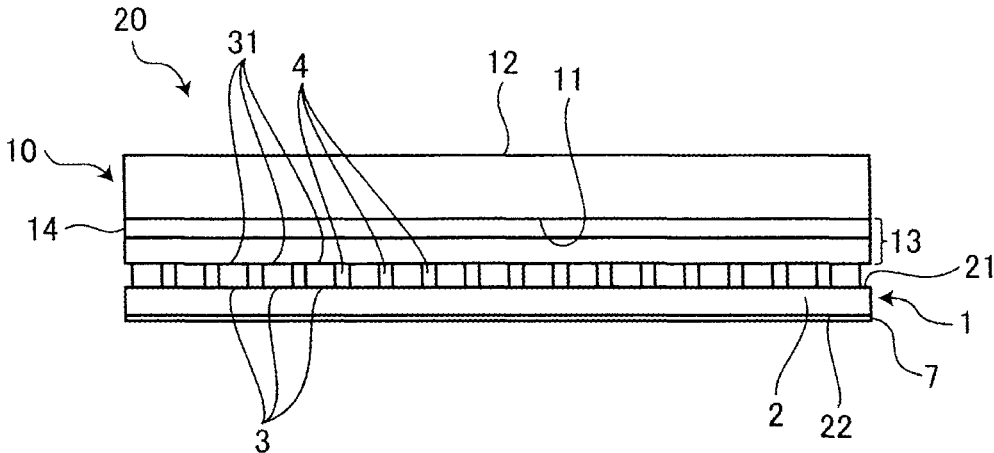
FIG. 8 is a side elevational view schematically illustrating the composite substrate that has undergone the joint member breaking step of the method of processing a wafer illustrated in FIG. 2.

FIG. 7 schematically illustrates in side elevation the joint member breaking step 104 of the method of processing a wafer illustrated in FIG. 2. FIG. 8 schematically illustrates in side elevation the composite substrate 20 that has undergone the joint member breaking step 104 of the method of processing a wafer illustrated in FIG. 2.

The joint member breaking step 104 is a step of breaking the joint member 13 by applying a laser beam 55 having a wavelength transmittable through the support substrate 10 and absorbable by the joint member 13 to the composite substrate 20 from the other surface 12 side of the support substrate 10. Specifically, as illustrated in FIG. 7, a laser processing apparatus 50 holds the vapor-deposited film 7 on the reverse side 22 of the wafer 1 under suction on a holding surface 52 of a chuck table 51 with the transfer member 32 interposed therebetween.

Hence, with the composite substrate 20 held on the holding surface 52 of the chuck table 51, the other surface 12 of the support substrate 10 faces upwardly. Next, the laser processing apparatus 50 actuates unillustrated processing feed means to move the chuck table 51 to a processing region below a condensing lens 54 of a laser beam applying unit 53, where an end of the composite substrate 20 is positioned directly below the condensing lens 54 of the laser beam applying unit 53.

Subsequently, the laser processing apparatus 50 sets a focused spot 56 of the laser beam 55 emitted from the condensing lens 54 in the joint member 13. Specifically, the laser processing apparatus 50 sets the focused spot 56 at a position in the joint member 13 that is spaced from a position bisecting the joint member 13 widthwise toward the support substrate 10.

Then, the laser processing apparatus 50 sets the output power of the laser beam 55 to a level capable of breaking only part of the joint member 13, and emits the laser beam 55 that is pulsed from a laser oscillator 57 of the laser beam applying unit 53, as illustrated in FIG. 7. The emitted laser beam 55 is reflected by a mirror 58 toward the condensing lens 54, which applies the pulsed laser beam 55 to the composite substrate 20. At the same time, the laser processing apparatus 50 moves the chuck table 51 in a processing feed direction extending horizontally in FIG. 7, with respect to the laser beam applying unit 53 at a predetermined processing feed speed.

Then, when the other end of the composite substrate 20 has reached the position below the condensing lens 54 of the laser beam applying unit 53, the laser processing apparatus 50 stops applying the laser beam 55 and stops moving the chuck table 51. Thereafter, the laser processing apparatus 50 moves the condensing lens 54 and the chuck table 51 relatively to each other in an indexing feed direction extending horizontally perpendicularly to the processing feed direction, after which the laser processing apparatus 50 applies the pulsed laser beam 55 to the composite substrate 20 while moving the chuck table 51 in the processing feed direction at the predetermined processing feed speed.

The laser processing apparatus 50 repeats the step of applying the pulsed laser beam 55 to the composite substrate 20 while moving the chuck table 51 in the processing feed direction at the predetermined processing feed speed, alternating with the step of moving the condensing lens 54 and the chuck table 51 relatively to each other in the indexing feed direction, until the laser beam 55 is applied all over the joint member 13. According to the present invention, alternatively, in the joint member breaking step 104, the laser processing apparatus 50 may apply the laser beam 55 all over the joint member 13 to break part of the joint member 13 by positioning the condensing lens 54 above an outermost edge of the composite substrate 20 and then moving the condensing lens 54 radially inwardly toward the center of the composite substrate 20 while rotating the chuck table 51 about its central axis. According to the present invention, further alternatively, in the joint member breaking step 104, the laser processing apparatus 50 may break part of the joint member 13 by sweeping the laser beam 55 spirally over the joint member 13 with such scanning means as a galvanomirror while keeping the chuck table 51 fixed against rotation.

According to the first embodiment, in the joint member breaking step 104, as illustrated in FIG. 8, the laser beam 55 is applied to the position in the joint member 13 that is spaced from the position bisecting the joint member 13 widthwise toward the support substrate 10, forming a broken or ruptured layer 14 partially in the joint member 13. If the joint member 13 were broken in its entirety by the laser beam 55, then the peelability of wafer 1 and the support substrate 10 from each other would be increased, though the patterns 3 on the wafer 1 might possibly be damaged upon rupture of the joint member 13. According to the present invention, preferably, the joint member 13 is partly broken in the joint member breaking step 104, and the peelability of wafer 1 and the support substrate 10 from each other is increased in the subsequent bending moment applying step 105 to be described below.

The bending moment applying step 105 is a step of, after the joint member breaking step 104 has been carried out, applying a bending moment 100 (see FIG. 10) to a region of the composite substrate 20 that includes an outer circumferential portion thereof. According to the first embodiment, the bending moment applying step 105 includes, as illustrated in FIG. 2, a holding step 1051, an outer circumferential portion suction holding step 1052, and an outer circumferential portion suction canceling step 1053.

Figure 9:
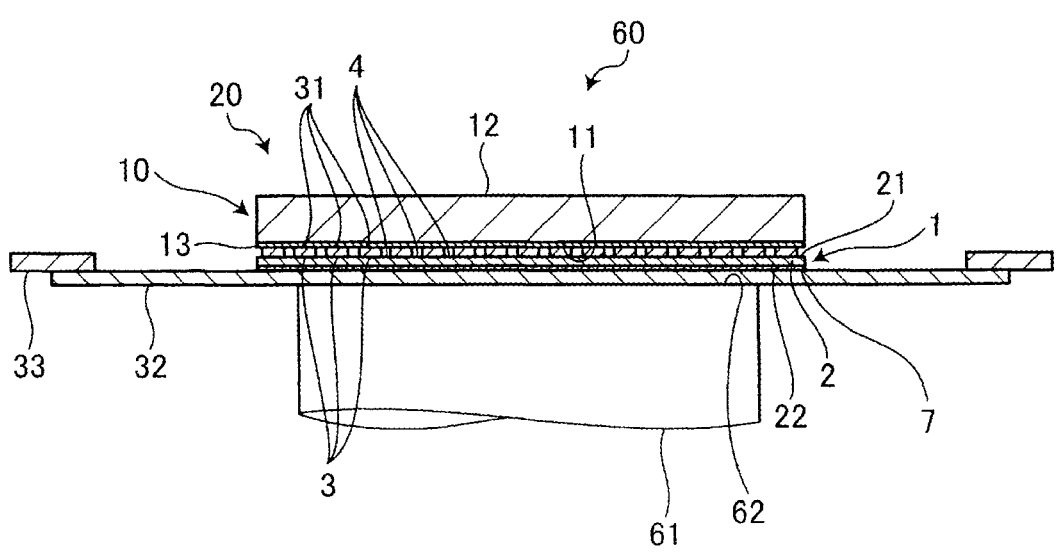
FIG. 9 is a schematic cross-sectional side view illustrating a holding step of a bending moment applying step of the method of processing a wafer illustrated in FIG. 2.

FIG. 9 is a schematic cross-sectional side view illustrating the holding step 1051 of the bending moment applying step 105 of the method of processing a wafer illustrated in FIG. 2. As illustrated in FIG. 9, the holding step 1051 is a step of holding the reverse side 22 of the wafer 1 of the composite substrate 20 on a holding surface 62 that lies flatwise horizontally of a chuck table 61 of a separating apparatus 60 with the transfer member 32 interposed therebetween. The holding surface 62 is fluidly connected to an unillustrated suction source.

According to the first embodiment, in the holding step 1051, as illustrated in FIG. 9, the reverse side 22 of the wafer 1 of the composite substrate 20 is placed on the holding surface 62 of the chuck table 61 with the transfer member 32 interposed therebetween.

Specifically, the suction source fluidly connected to the holding surface 62 is actuated to apply suction forces to the holding surface 62, and hence, the reverse side 22 in its entirety of the wafer 1 is held under suction on the holding surface 62 of the chuck table 61 with the transfer member 32 interposed therebetween.

Figure 10:
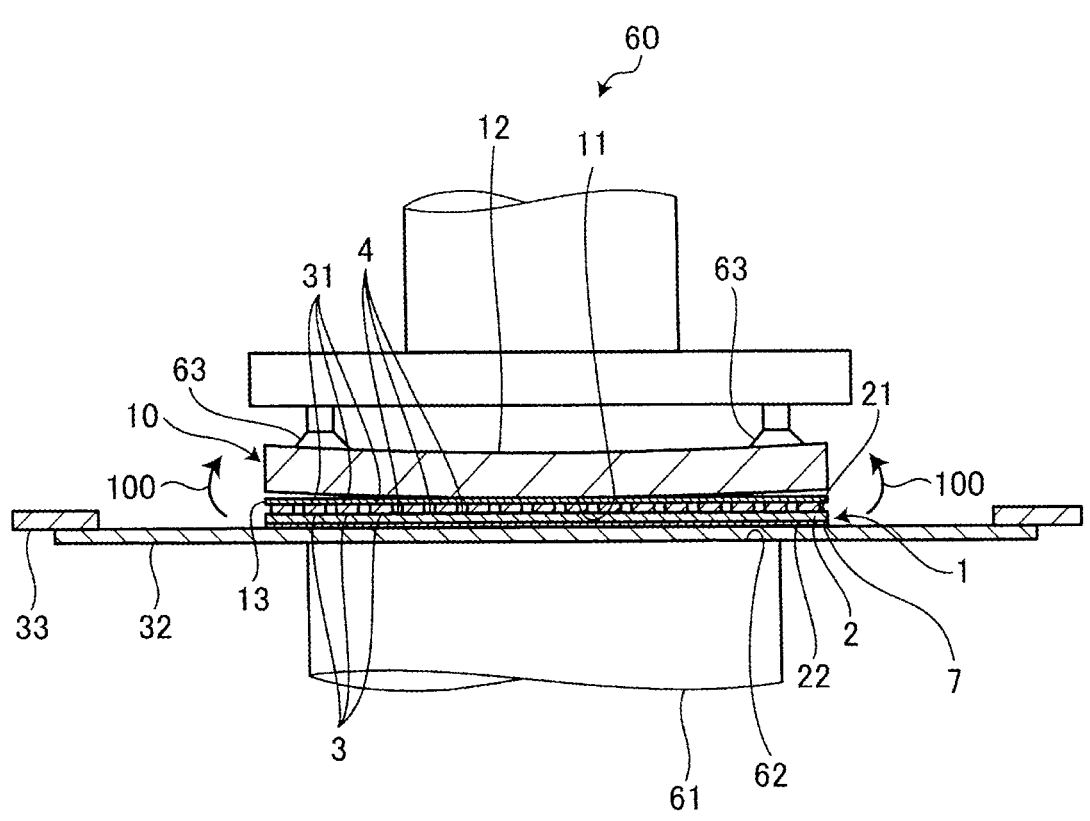
FIG. 10 is a schematic cross-sectional side view illustrating an outer circumferential portion suction holding step of the bending moment applying step of the method of processing a wafer illustrated in FIG. 2.

FIG. 10 is a schematic cross-sectional side view illustrating the outer circumferential portion suction holding step 1052 of the bending moment applying step 105 of the method of processing a wafer illustrated in FIG. 2. The outer circumferential portion suction holding step 1052 is a step of applying a bending moment 100 to the region of the composite substrate 20 that includes the outer circumferential portion thereof, by causing a plurality of suction pads 63 to hold under suction an outer circumferential portion of the other surface 12 of the support substrate 10 of the composite substrate 20.

According to the first embodiment, in the outer circumferential portion suction holding step 1052, the separating apparatus 60 lowers the suction pads 63 to bring the suction pads 63 that are fluidly connected to an unillustrated suction source into contact with the outer circumferential portion of the other surface 12 of the support substrate 10 of the composite substrate 20. Then, the suction source is actuated to generate and impose suction forces on the suction pads 63, enabling the suction pads 63 to hold under suction the outer circumferential portion of the other surface 12 of the support substrate 10 of the composite substrate 20.

Then, as illustrated in FIG. 10, the separating apparatus 60 lifts the suction pads 63 that have held under suction the outer circumferential portion of the other surface 12 of the support substrate 10 a predetermined distance away from the chuck table 61. Since the suction pads 63 are holding under suction the outer circumferential portion of the other surface 12 of the support substrate 10 and the holding surface 62 of the chuck table 61 is holding under suction the entire reverse side 22 of the wafer 1 with the transfer member 32 interposed therebetween, the bending moment 100 oriented in a direction away from the wafer 1 is applied to the outer circumferential portion of the support substrate 10 of the composite substrate 20.

Figure 11:
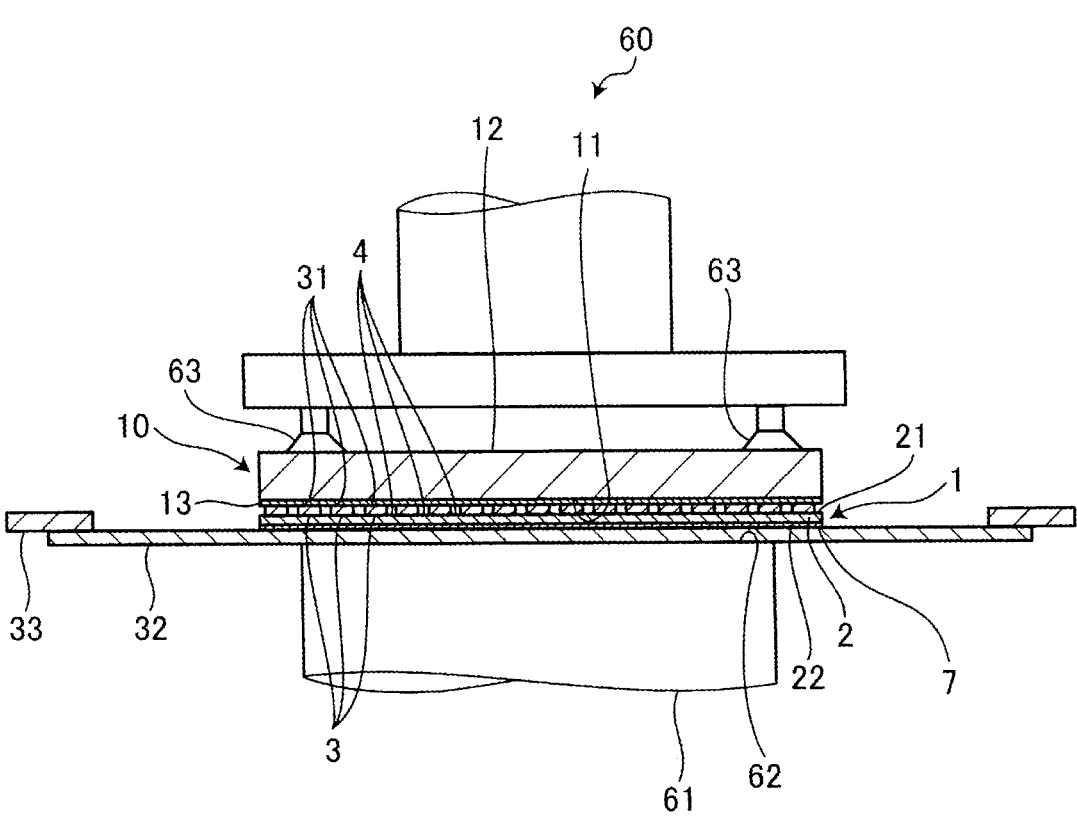
FIG. 11 is a schematic cross-sectional side view illustrating an outer circumferential portion suction canceling step of the bending moment applying step of the method of processing a wafer illustrated in FIG. 2.

FIG. 11 is a schematic cross-sectional side view illustrating the outer circumferential portion suction canceling step 1053 of the bending moment applying step 105 of the method of processing a wafer illustrated in FIG. 2. The outer circumferential portion suction canceling step 1053 is a step of causing the suction pads 63 to stop holding under suction the support substrate 10 of the composite substrate 20.

According to the first embodiment, in the outer circumferential portion suction canceling step 1053, as illustrated in FIG. 11, the separating apparatus 60 causes the suction pads 63 to stop holding under suction the outer circumferential portion of the support substrate 10 of the composite substrate 20 and lowers the suction pads 63 a predetermined distance.

Thereafter, the separating apparatus 60 repeats the outer circumferential portion suction holding step 1052 and the outer circumferential portion suction canceling step 1053 a predetermined number of times, e.g., twice through twenty times, each, and then determines whether the outer circumferential portion suction holding step 1052 and the outer circumferential portion suction canceling step 1053 have finished or not (step 1054 in FIG. 2). If the separating apparatus 60 has not repeated the outer circumferential portion suction holding step 1052 and the outer circumferential portion suction canceling step 1053 the predetermined number of times, each, and has determined that the outer circumferential portion suction holding step 1052 and the outer circumferential portion suction canceling step 1053 have not finished (step 1054: No), then the sequence goes back to the outer circumferential portion suction holding step 1052. Back in the outer circumferential portion suction holding step 1052, the separating apparatus 60 lowers the suction pads 63, causes the suction pads 63 to hold under suction the outer circumferential portion of the other surface 12 of the support substrate 10, and lifts the suction pads 63 the predetermined distance while the suction pads 63 are holding under suction the outer circumferential portion of the other surface 12 of the support substrate 10.

With the method of processing a wafer according to the first embodiment, as described above, while the entire reverse side 22 of the wafer 1 is being held under suction on the chuck table 61 with the transfer member 32 interposed therebetween, the outer circumferential portion suction holding step 1052 and the outer circumferential portion suction canceling step 1053 are repeated to apply the bending moment 100 oriented in the direction away from the wafer 1 a predetermined number of times repeatedly to the outer circumferential portion of the support substrate 10. Inasmuch as the broken layer 14 has been formed in the joint member 13, the repeated application of the bending moment 100 causes the support substrate 10 and the wafer 1 to be separated or peeled off from each other.

If the separating apparatus 60 has repeated the outer circumferential portion suction holding step 1052 and the outer circumferential portion suction canceling step 1053 the predetermined number of times, each, and has determined that the outer circumferential portion suction holding step 1052 and the outer circumferential portion suction canceling step 1053 have finished (step 1054: Yes), then the sequence goes to the transferring step 106.

Figure 12:
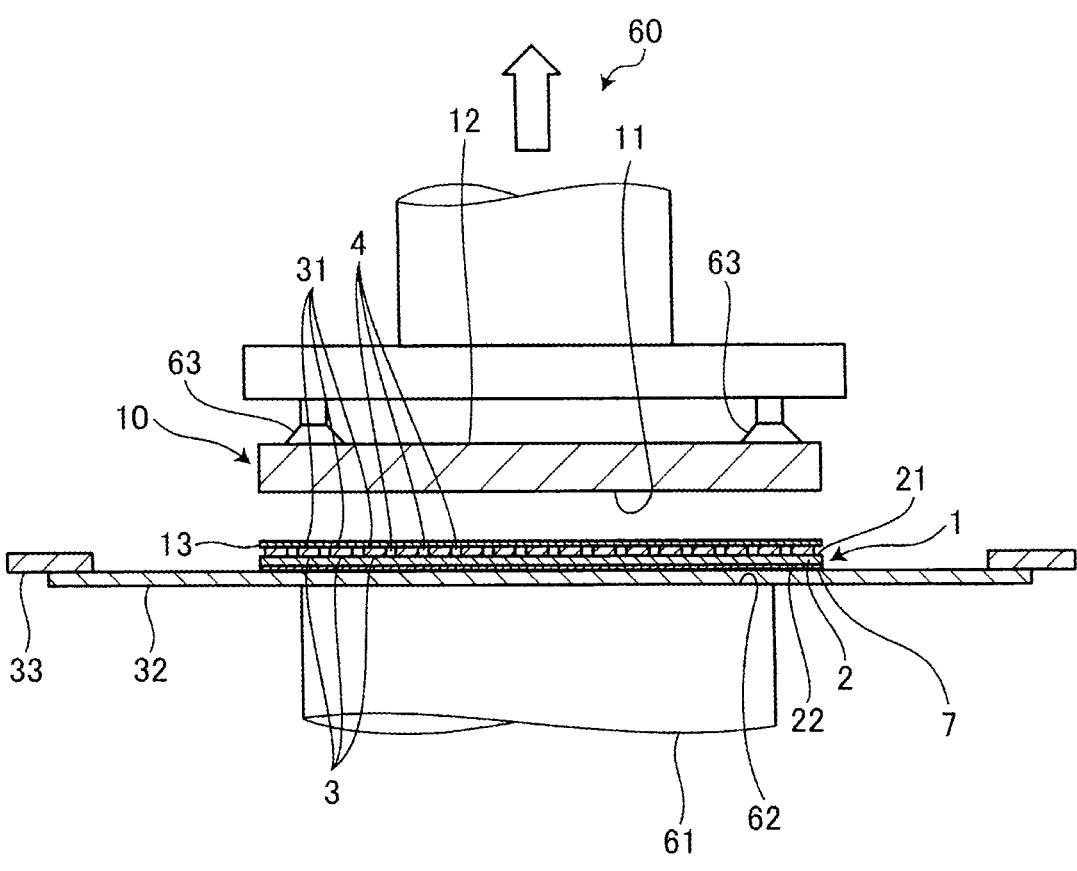
FIG. 12 is a schematic cross-sectional side view illustrating a transferring step of the method of processing a wafer illustrated in FIG. 2.

FIG. 12 is a schematic cross-sectional side view illustrating the transferring step 106 of the method of processing a wafer illustrated in FIG. 2. The transferring step 106 is a step of, after the joint member breaking step 104 and the bending moment applying step 105 have been carried out, transferring the wafer 1 peeled off from the support substrate 10 to the transfer member 32.

According to the first embodiment, in the transferring step 106, as illustrated in FIG. 12, after the joint member breaking step 104 and the bending moment applying step 105 have been carried out, the separating apparatus 60 lifts the suction pads 63 that have attracted under suction the outer circumferential portion of the other surface 12 of the support substrate 10 away from the chuck table 61, separating the wafer 1 and the support substrate 10 from each other. In this manner, the wafer 1 that has been thinned down in the grinding step 102 is transferred from the support substrate 10 to the transfer member 32.

After the transferring step 106, the joint member 13 remains on the face sides 31 of the patterns 3 on the wafer 1. The joint member 13 that remains on the face sides 31 of the patterns 3 is removed by cleaning or asking.

Figure 13:
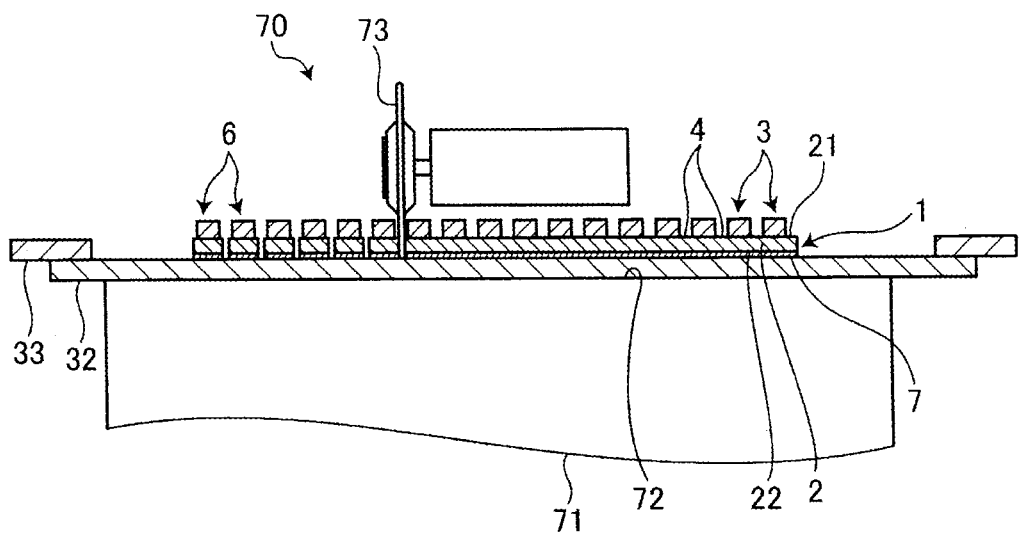
FIG. 13 is a schematic cross-sectional side view illustrating an example of a dividing step of the method of processing a wafer illustrated in FIG. 2.
Figure 14:
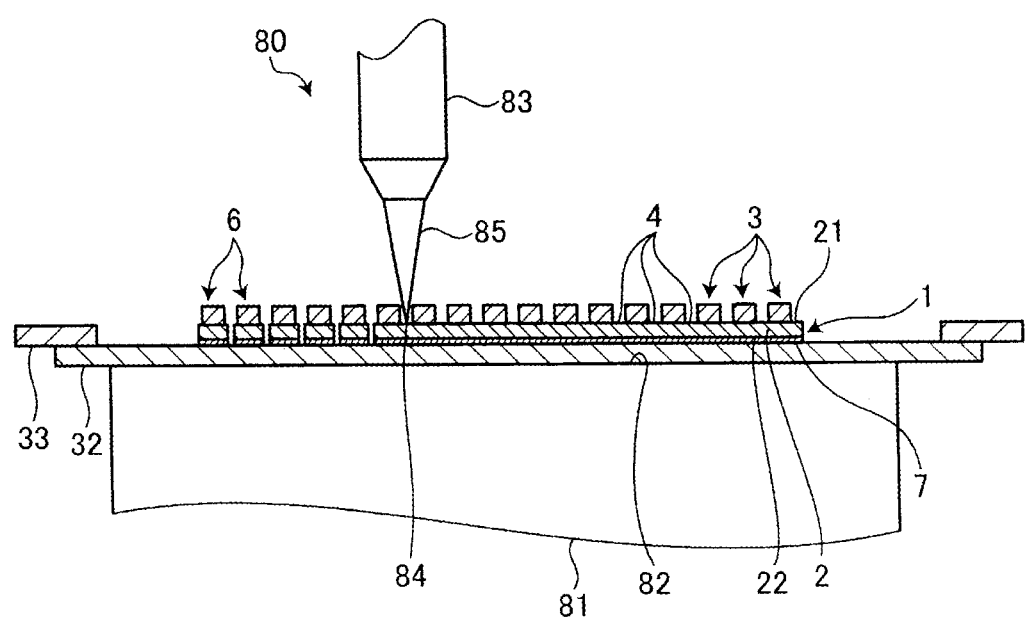
FIG. 14 is a schematic cross-sectional side view illustrating another example of the dividing step of the method of processing a wafer illustrated in FIG. 2.

FIG. 13 is a schematic cross-sectional side view illustrating an example of the dividing step 107 of the method of processing a wafer illustrated in FIG. 2. FIG. 14 is a schematic cross-sectional side view illustrating another example of the dividing step 107 of the method of processing a wafer illustrated in FIG. 2.

The dividing step 107 is a step of dividing the wafer 1 into individual chips 6 before the joint member breaking step 104 is carried out or after the joint member breaking step 104 has been carried out. According to the first embodiment, the dividing step 107 is a step of dividing the wafer 1 into individual chips 6 after the joint member breaking step 104, the bending moment applying step 105, and the transferring step 106.

According to the first embodiment, in the example of the dividing step 107 illustrated in FIG. 13, a cutting apparatus 70 holds the reverse side 22 of the wafer 1 under suction on a holding surface 72 of a chuck table 71 with the transfer member 32 interposed therebetween. Then, the cutting apparatus 70 forces a cutting blade 73 to cut into the wafer 1 until it reaches the transfer member 32 while moving the chuck table 71 and the cutting blade 73 relatively to each other along the projected dicing lines 4, thereby dividing the wafer 1 into individual chips 6.

According to the first embodiment, in the other example of the dividing step 107 illustrated in FIG. 14, a laser processing apparatus 80 holds the reverse side 22 of the wafer 1 under suction on a holding surface 82 of a chuck table 81 with the transfer member 32 interposed therebetween. Then, the laser processing apparatus 80 applies a laser beam 85 having a wavelength absorbable by the substrate 2 from a laser beam applying unit 83 to the wafer 1 with a focused spot 84 of the laser beam 85 set on the face side 21 of the substrate 2 while moving the chuck table 81 and the laser beam applying unit 83 relatively to each other along the projected dicing lines 4, thereby dividing the wafer 1 into individual chips 6 by way of ablation.

The individual chips 6 produced by dividing the wafer 1 will be picked up from the transfer member 32 and mounted on a mounting board.

The method of processing a wafer according to the first embodiment described above is advantageous in that the risk of breaking the wafer 1 is smaller than a conventional method of softening the joint member 13 by heating and sliding the support substrate 10 and the wafer 1 relatively to each other, since, in the joint member breaking step 104, the laser beam 55 is applied to the composite substrate 20 to form the broken layer 14 in the joint member 13, thereby peeling off the support substrate 10 and the wafer 1 from each other. As a result, the method of processing a wafer according to the first embodiment makes it possible to reduce the risk of breaking the wafer 1 at the time when the wafer 1 with the patterns 3 formed thereon is thinned down.

Moreover, the method of processing a wafer according to the first embodiment is able to restrain the wafer 1 from being broken and also the patterns 3 from being damaged due to impacts, such as evaporation and thermal stress of the joint member 13 on the wafer 1 at the time when the laser beam 55 is applied to the wafer 1, since the focused spot 56 of the laser beam 55 is set at the position in the joint member 13 that is spaced from the position bisecting the joint member 13 widthwise toward the support substrate 10 and the output power of the laser beam 55 is set to the level capable of breaking only part of the joint member 13 before the laser beam 55 is applied.

Further, the method of processing a wafer according to the first embodiment is able to reliably peel off the wafer 1 that has been thinned down from the support substrate 10 and transfer the wafer 1 to the transfer member 32 since the bending moment 100 is repeatedly applied in the bending moment applying step 105 after the joint member breaking step 104.

Figure 15:
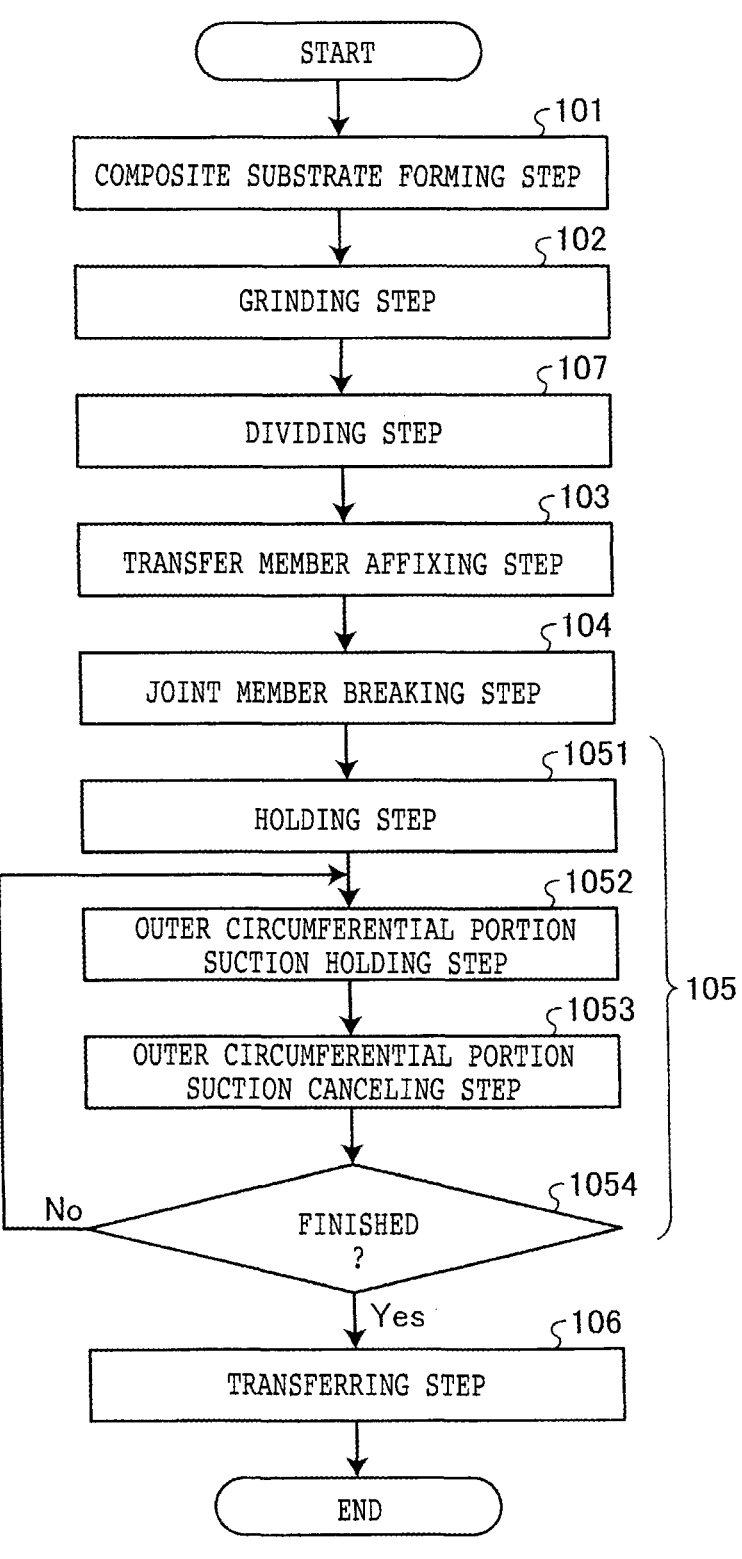
FIG. 15 is a flowchart of the sequence of a method of processing a wafer according to a second embodiment of the present invention.
Figure 16:
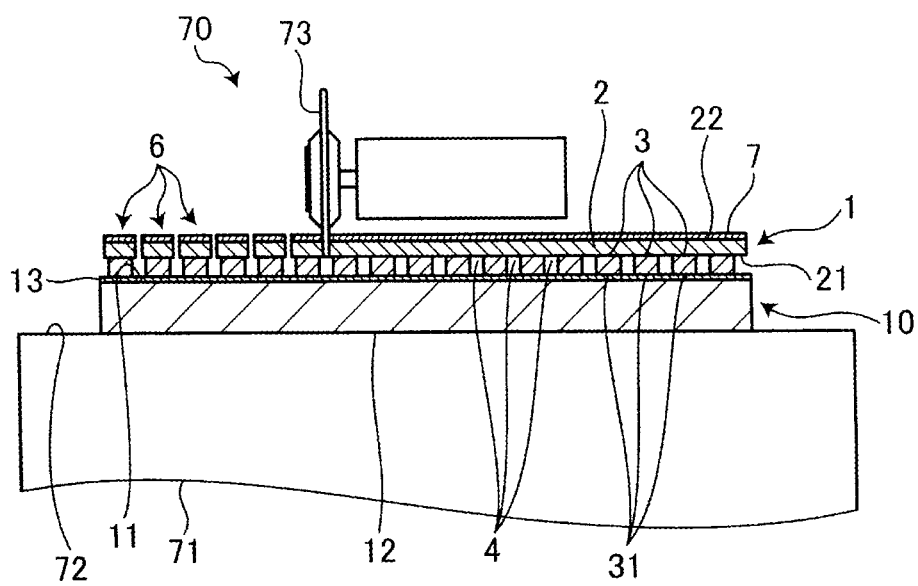
FIG. 16 is a schematic cross-sectional side view illustrating an example of a dividing step of the method of processing a wafer illustrated in FIG. 15.
Figure 17:
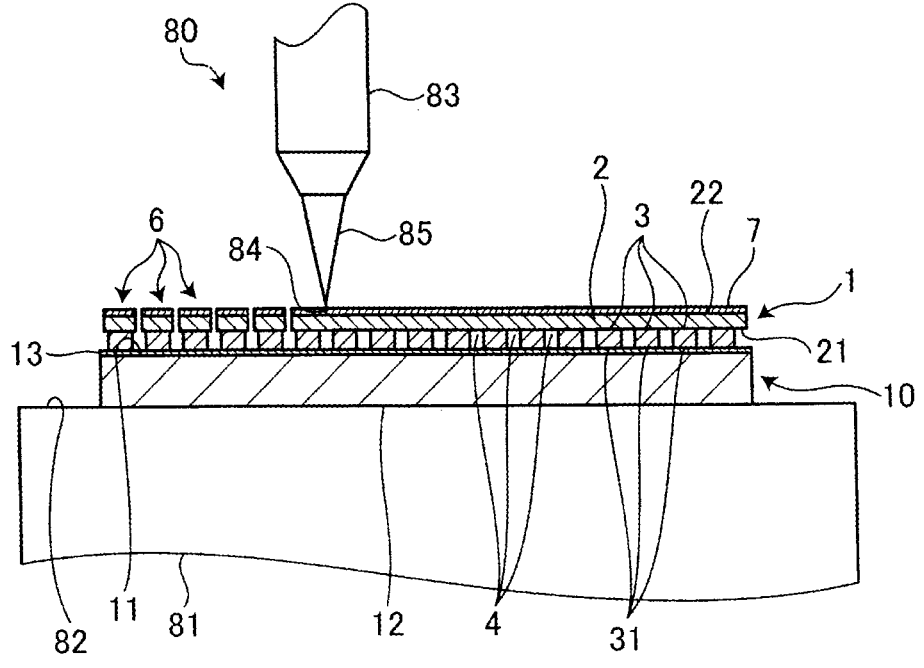
FIG. 17 is a schematic cross-sectional side view illustrating another example of the dividing step of the method of processing a wafer illustrated in FIG. 15.

A method of processing a wafer according to a second embodiment of the present invention will be described below with reference to the drawings. FIG. 15 is a flowchart of the sequence of the method of processing a wafer according to the second embodiment. FIG. 16 is a schematic cross-sectional side view illustrating an example of a dividing step of the method of processing a wafer illustrated in FIG. 15. FIG. 17 is a schematic cross-sectional side view illustrating another example of the dividing step of the method of processing a wafer illustrated in FIG. 15. Those parts illustrated in FIGS. 15, 16, and 17 that are identical to those of the first embodiment are denoted by identical reference characters and will be omitted from detailed description.

The method of processing a wafer according to the second embodiment is the same as the method of processing a wafer according to the first embodiment except that the dividing step 107 is carried out before the joint member breaking step 104 is carried out. According to the second embodiment, in the dividing step 107, the wafer 1 is divided into individual chips 6 along the projected dicing lines 4 after the grinding step 102 has been carried out but before the transfer member affixing step 103 and the joint member breaking step 104 are carried out.

According to the second embodiment, in the example of the dividing step 107, as illustrated in FIG. 16, the cutting apparatus 70 holds the face side 21 of the wafer 1 under suction on the holding surface 72 of the chuck table 71 with the support substrate 10 interposed therebetween. Then, the cutting apparatus 70 forces the cutting blade 73 to cut into the wafer 1 until it reaches the substrate 2 while moving the chuck table 71 and the cutting blade 73 relatively to each other along the projected dicing lines 4, thereby dividing the wafer 1 into individual chips 6.

According to the second embodiment, in the other example of the dividing step 107, as illustrated in FIG. 17, the laser processing apparatus 80 holds the face side 21 of the wafer 1 under suction on the holding surface 82 of the chuck table 81 with the support substrate 10 interposed therebetween. Then, the laser processing apparatus 80 applies the laser beam 85 having the wavelength absorbable by the substrate 2 from the laser beam applying unit 83 to the wafer 1 with the focused spot 84 of the laser beam 85 set on the reverse side 22 of the substrate 2 while moving the chuck table 81 and the laser beam applying unit 83 relatively to each other along the projected dicing lines 4, thereby dividing the wafer 1 into individual chips 6 by way of ablation.

The method of processing a wafer according to the second embodiment is advantageous in that the risk of breaking the wafer 1 is reduced, since, in the joint member breaking step 104, the laser beam 55 is applied to the composite substrate 20 to form the broken layer 14 in the joint member 13, thereby peeling off the support substrate 10 and the wafer 1 from each other, and the risk of breaking the wafer 1 is reduced at the time when the wafer 1 with the patterns 3 formed thereon is thinned down, as with the first embodiment.

Figure 18:
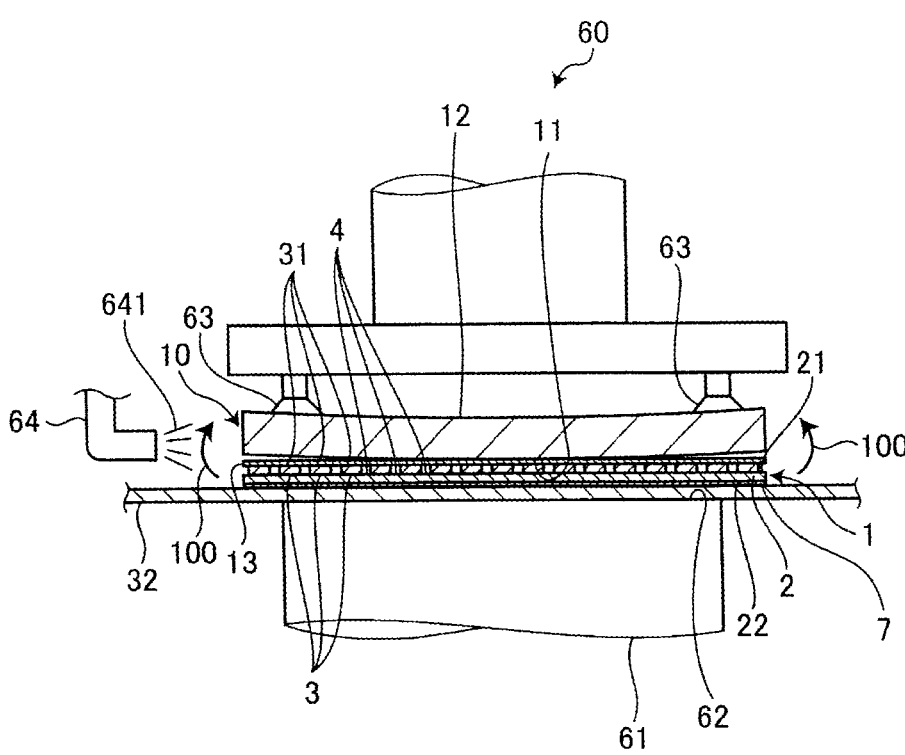
FIG. 18 is a schematic cross-sectional side view illustrating an outer circumferential portion suction holding step of a bending moment applying step of a method of processing a wafer according to a first modification of the first embodiment and the second embodiment.

A method of processing a wafer according to a first modification of the first embodiment and the second embodiment will be described below with reference to the drawings. FIG. 18 is a schematic cross-sectional side view illustrating an outer circumferential portion suction holding step of a bending moment applying step of the method of processing a wafer according to the first modification of the first embodiment and the second embodiment. Those parts illustrated in FIG. 18 that are identical to those of the first embodiment and the second embodiment are denoted by identical reference characters and will be omitted from detailed description.

The method of processing a wafer according to the first modification is the same as the methods of processing a wafer according to the first embodiment and the second embodiment except that while the separating apparatus 60 is repeating the outer circumferential portion suction holding step 1052 and the outer circumferential portion suction canceling step 1053 of the bending moment applying step 105, as illustrated in FIG. 18, the separating apparatus 60 ejects fluid 641, e.g., pressurized gas in the first modification, from a fluid ejection nozzle 64 to the joint member 13 at the boundary between the support substrate 10 and the wafer 1.

According to the first modification, during the repetition of the outer circumferential portion suction holding step 1052 and the outer circumferential portion suction canceling step 1053, the separating apparatus 60 may eject the fluid 641 to the joint member 13 while appropriately changing the position of the fluid ejection nozzle 64, or may eject the fluid 641 to the joint member 13 without changing the position of the fluid ejection nozzle 64 that has an inside diameter of approximately 3 mm, for example. According to the first modification, further, the fluid ejection nozzle 64 should preferably eject the fluid 641 at a rate of 30 l/min. or higher, and may blow the fluid 641 as a continuous stream at all times or may blow the fluid 641 intermittently as a pulsed stream at a frequency ranging from approximately 5 to 6 Hz, though blowing the fluid 641 intermittently as a pulsed stream is more effective. FIG. 18 illustrates the first modification of the first embodiment as a representative example. According to the present invention, however, the first modification of the second embodiment is similarly reduced to practice.

The method of processing a wafer according to the first modification is advantageous in that the risk of breaking the wafer 1 is smaller than the conventional method of softening the joint member 13 by heating and sliding the support substrate 10 and the wafer 1 relatively to each other, since, in the joint member breaking step 104, the laser beam 55 is applied to the composite substrate 20 to form the broken layer 14 in the joint member 13, thereby peeling off the support substrate 10 and the wafer 1 from each other. Thus, the method of processing a wafer according to the first modification makes it possible to reduce the risk of breaking the wafer 1 at the time when the wafer 1 with the patterns 3 formed thereon is thinned down, as with the first embodiment.

Figure 19:
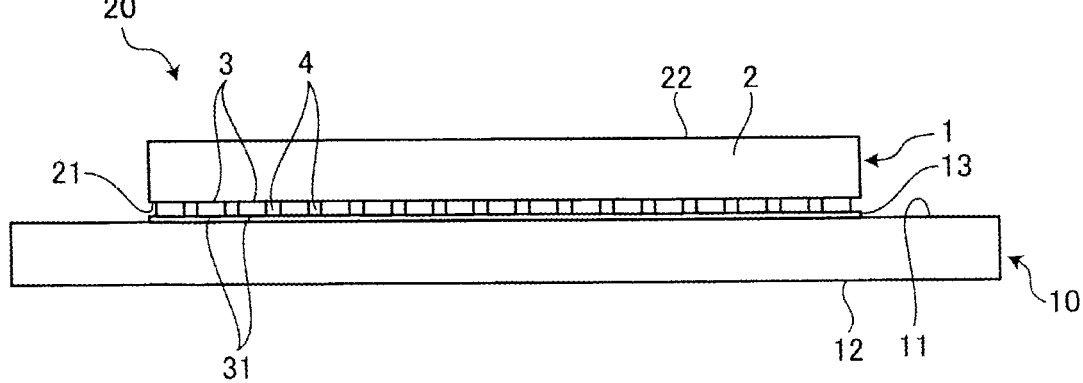
FIG. 19 is a side elevational view schematically illustrating a composite substrate formed in a composite substrate forming step of a method of processing a wafer according to a second modification of the first embodiment and the second embodiment.

A method of processing a wafer according to a second modification of the first embodiment and the second embodiment will be described below with reference to the drawings. FIG. 19 schematically illustrates in side elevation a composite substrate formed in a composite substrate forming step of the method of processing a wafer according to the second modification of the first embodiment and the second embodiment. Those parts illustrated in FIG. 19 that are identical to those of the first embodiment and the second embodiment are denoted by identical reference characters and will be omitted from detailed description.

The method of processing a wafer according to the second modification is the same as the methods of processing a wafer according to the first embodiment and the second embodiment except that the composite substrate 20 is constructed such that the support substrate 10 is larger in diameter than the wafer 1 and the support substrate 10 and the wafer 1 are positioned coaxially with each other.

The method of processing a wafer according to the second modification is advantageous in that the risk of breaking the wafer 1 is smaller than the conventional method of softening the joint member 13 by heating and sliding the support substrate 10 and the wafer 1 relatively to each other, since, in the joint member breaking step 104, the laser beam 55 is applied to the composite substrate 20 to form the broken layer 14 in the joint member 13, thereby peeling off the support substrate 10 and the wafer 1 from each other. Thus, the method of processing a wafer according to the second modification makes it possible to reduce the risk of breaking the wafer 1 at the time when the wafer 1 with the patterns 3 formed thereon is thinned down, as with the first embodiment.

Moreover, with the method of processing a wafer according to the second modification, since the support substrate 10 is larger in diameter than the wafer 1, the bending moment 100 is applied to the outer circumferential portion of the support substrate 10 particularly by the mass of a portion of the support substrate 10 that extends radially outwardly from the outer edge of the wafer 1 in the bending moment applying step 105. As a consequence, the method of processing a wafer according to the second modification makes it possible to separate the support substrate 10 and the wafer 1 from each other in the bending moment applying step 105.

Figure 20:
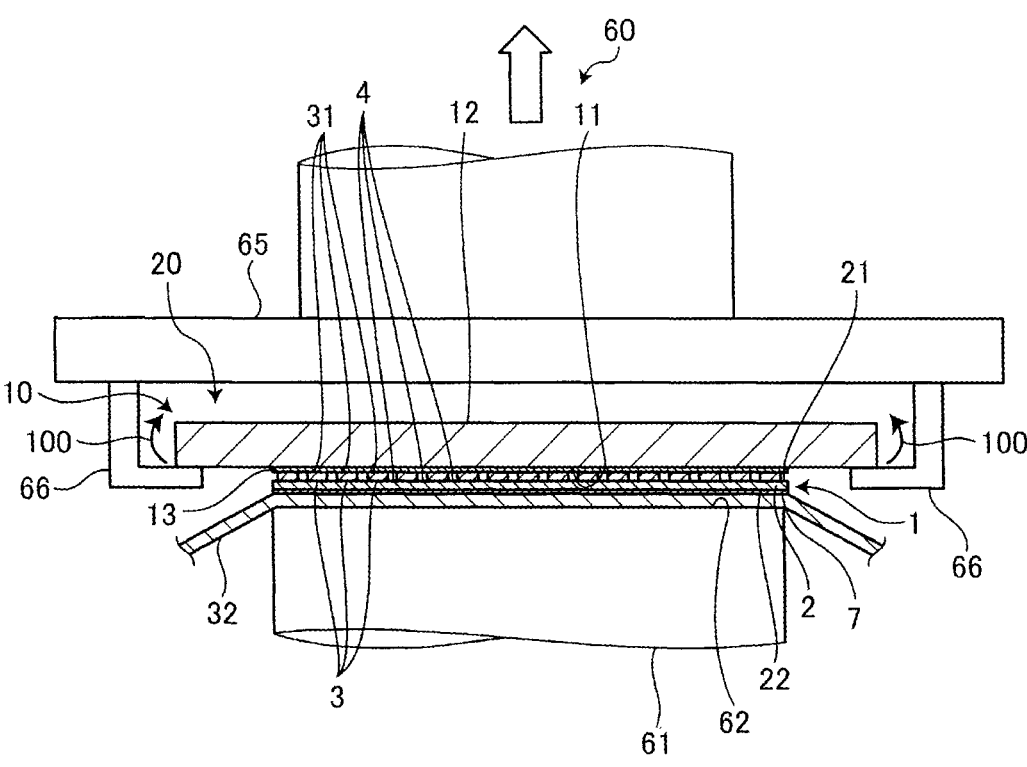
FIG. 20 is a schematic cross-sectional side view illustrating a bending moment applying step of a method of processing a wafer according to a third modification of the first embodiment and the second embodiment.

A method of processing a wafer according to a third modification of the first embodiment and the second embodiment will be described below with reference to the drawings. FIG. 20 is a schematic cross-sectional side view illustrating a bending moment applying step of the method of processing a wafer according to the third modification of the first embodiment and the second embodiment. Those parts illustrated in FIG. 20 that are identical to those of the first embodiment and the second embodiment are denoted by identical reference characters and will be omitted from detailed description.

The method of processing a wafer according to the third modification is the same as the methods of processing a wafer according to the first embodiment and the second embodiment except that the bending moment applying step 105 is different particularly in a case where the support substrate 10 is larger in diameter than the wafer 1 as in the second modification.

With the method of processing a wafer according to the third modification, in the bending moment applying step 105, as illustrated in FIG. 20, the separating apparatus 60 holds the reverse side 22 in its entirety of the wafer 1 of the composite substrate 20 under suction on the holding surface 62 of the chuck table 61 with the transfer member 32 interposed therebetween. Then, the separating apparatus 60 repeats, a predetermined number of times, the operation of clamping a portion of the support substrate 10 that extends radially outwardly from the outer edge of the wafer 1 with clamps 66 of a bending moment applying unit 65 that is movable in directions perpendicular to the holding surface 62, and moving the bending moment applying unit 65 back and forth in the directions perpendicular to the holding surface 62, thereby applying a bending moment 100 to the outer circumferential portion of the composite substrate 20, in particular, the support substrate 10. FIG. 20 illustrates the third modification of the first embodiment as a representative example. According to the present invention, however, the third modification of the second embodiment is similarly reduced to practice.

The method of processing a wafer according to the third modification is advantageous in that the risk of breaking the wafer 1 is smaller than the conventional method of softening the joint member 13 by heating and sliding the support substrate 10 and the wafer 1 relatively to each other, since, in the joint member breaking step 104, the laser beam 55 is applied to the composite substrate 20 to form the broken layer 14 in the joint member 13, thereby peeling off the support substrate 10 and the wafer 1 from each other. Thus, the method of processing a wafer according to the third modification makes it possible to reduce the risk of breaking the wafer 1 at the time when the wafer 1 with the patterns 3 formed thereon is thinned down, as with the first embodiment.

Figure 21:
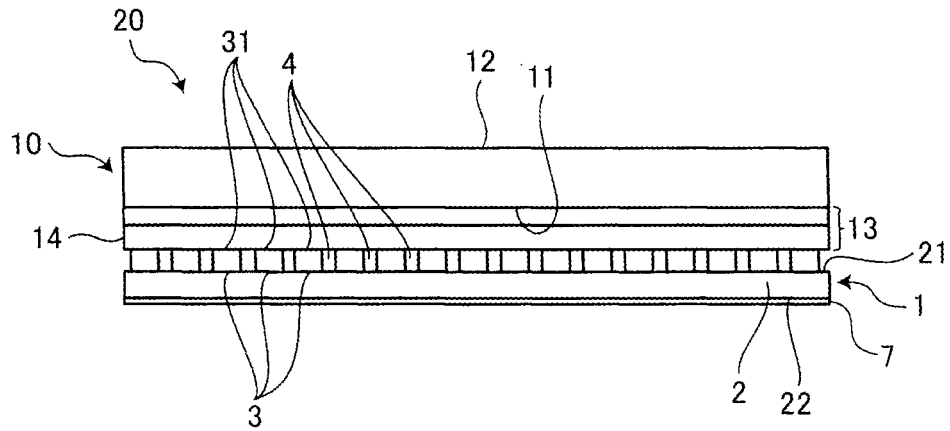
FIG. 21 is a side elevational view schematically illustrating a composite substrate that has undergone a joint member breaking step of a method of processing a wafer according to a fourth modification of the first embodiment and the second embodiment.

A method of processing a wafer according to a fourth modification of the first embodiment and the second embodiment will be described below with reference to the drawings. FIG. 21 schematically illustrates in side elevation a composite substrate that has undergone a joint member breaking step of the method of processing a wafer according to the fourth modification of the first embodiment and the second embodiment. Those parts illustrated in FIG. 21 that are identical to those of the first embodiment and the second embodiment are denoted by identical reference characters and will be omitted from detailed description.

The method of processing a wafer according to the fourth modification is the same as the methods of processing a wafer according to the first embodiment and the second embodiment except that, in the joint member breaking step 104, the laser processing apparatus 50 sets the focused spot 56 of the laser beam 55 at a position in the joint member 13 that is spaced from a position bisecting the joint member 13 widthwise toward the wafer 1, sets the output power of the laser beam 55 to a level capable of breaking only part of the joint member 13, and emits the laser beam 55. According to the fourth modification, in the joint member breaking step 104, as illustrated in FIG. 21, the broken layer 14 is formed at the position in the joint member 13 that is spaced from the position bisecting the joint member 13 widthwise toward the wafer 1. FIG. 21 illustrates the fourth modification of the first embodiment as a representative example. According to the present invention, however, the fourth modification of the second embodiment is similarly reduced to practice.

The method of processing a wafer according to the fourth modification is advantageous in that the risk of breaking the wafer 1 is smaller than the conventional method of softening the joint member 13 by heating and sliding the support substrate 10 and the wafer 1 relatively to each other, since, in the joint member breaking step 104, the laser beam 55 is applied to the composite substrate 20 to form the broken layer 14 in the joint member 13, thereby peeling off the support substrate 10 and the wafer 1 from each other. Thus, the method of processing a wafer according to the fourth modification makes it possible to reduce the risk of breaking the wafer 1 at the time when the wafer 1 with the patterns 3 formed thereon is thinned down, as with the first embodiment.

The present invention is not limited to the above embodiments and modifications. Various changes and modifications may be made therein without departing from the gist of the invention. According to the present invention, for example, the transfer member affixing step 103 may be carried out after the joint member breaking step 104. According to the present invention, moreover, in a case where the wafer 1 is warped due to the vapor-deposited film 7 formed on the reverse side 22 of the wafer 1, the bending moment 100 is applied to the outer circumferential portion of the composite substrate 20 simply when the wafer 1 is held under suction on the chuck table 61. In the bending moment applying step 105, therefore, the chuck table 61 may repeat the step of holding the wafer 1 under suction and stopping holding the wafer 1 under suction to apply the bending moment 100 to the composite substrate 20.

According to the present invention, after the outer circumferential portion suction canceling step 1053 of the bending moment applying step 105, the separating apparatus 60 may control a camera to capture an image of the support substrate 10 from an upper side, determine from the captured image whether the extent to which gas produced when the broken layer 14 has been formed is developed has reached a predetermined value or not, and determine whether the sequence is to go back to the outer circumferential portion suction holding step 1052 or not. For example, if the separating apparatus 60 determines that the extent to which the gas is developed has not reached the predetermined value, then the sequence goes back to the outer circumferential portion suction holding step 1052, and if the separating apparatus 60 determines that the extent to which the gas is developed has reached the predetermined value, then the sequence goes to the transferring step 106.

According to the present invention, moreover, the transferring step 106 may be carried out by applying ultrasonic vibrations to at least either the support substrate 10 or the wafer 1. According to the present invention, moreover, the vapor-deposited film 7 may not be formed on the reverse side 22 of the wafer 1.

According to the present invention, furthermore, in a case where the support substrate 10 is larger in diameter than the wafer 1, the bending moment 100 may be applied to the composite substrate 20 by repeating the outer circumferential portion suction holding step 1052 and the outer circumferential portion suction canceling step 1053 to repeat the step of holding the wafer 1 under suction and stopping holding the wafer 1 under suction.

According to the above embodiments and modifications, the bending moment 100 is applied to the composite substrate 20 by lowering or lifting the suction pads 63. According to the present invention, however, the bending moment 100 may be applied to the composite substrate 20 by fixing the suction pads 63 in position and lowering or lifting the chuck table 61.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of processing a wafer, comprising:
   a composite substrate forming step of joining a face side of a wafer with patterns formed in respective areas demarcated on the face side by a plurality of projected dicing lines established thereon and a surface of a support substrate to each other with a joint member interposed therebetween;

a grinding step of, after the composite substrate forming step has been carried out, grinding a reverse side of the wafer of the composite substrate to thin down the wafer to a finished thickness;

a transfer member affixing step of affixing a transfer member to the reverse side of the wafer that has been ground in the grinding step;

a joint member breaking step of breaking the joint member by applying a laser beam having a wavelength transmittable through the support substrate and absorbable by the joint member to the composite substrate from another surface side of the support substrate without peeling off the support substrate; and a support substate peeling step of, after the joint member breaking step has been carried out, peeling off the support substrate from the wafer.

2. The method of processing a wafer according to claim 1, further comprising:

a dividing step of, before the joint member breaking step is carried out or after the joint member breaking step has been carried out, dividing the wafer along the projected dicing lines.

3. The method of processing a wafer according to claim 1, further comprising:

a bending moment applying step of, after the joint member breaking step has been carried out, applying a bending moment to a region of the composite substrate that includes an outer circumferential portion thereof.

4. The method of processing a wafer according to claim 3, wherein the bending moment applying step is repeatedly carried out.

5. The method of processing a wafer according to claim 1, wherein a broken layer is formed in the joint member when the laser beam is applied to break the joint member.

* * * * *